(12) United States Patent
Lee

(10) Patent No.: US 7,522,469 B2
(45) Date of Patent: Apr. 21, 2009

(54) MEMORY DEVICE HAVING SMALL CLOCK BUFFER

(75) Inventor: Sang-Kwon Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 55 days.

(21) Appl. No.: 11/823,943

(22) Filed: Jun. 29, 2007

(65) Prior Publication Data
US 2008/0080290 A1    Apr. 3, 2008

(30) Foreign Application Priority Data
Sep. 29, 2006    (KR)    .................... 10-2006-0096305

(51) Int. Cl.
*G11C 8/00*    (2006.01)
(52) U.S. Cl. ................ 365/233.1; 365/189.05
(58) Field of Classification Search ............. 365/233.1, 365/189.05, 194, 233.5
See application file for complete search history.

(56) References Cited

U.S. PATENT DOCUMENTS

| | | | | |
|---|---|---|---|---|
| 6,104,643 | A  * | 8/2000 | Merritt | .................. 365/189.05 |
| 6,154,415 | A  * | 11/2000 | Jeong | ...................... 365/233.1 |
| 6,385,106 | B2 | 5/2002 | Choi | |
| 6,744,687 | B2 | 6/2004 | Koo et al. | |
| 6,870,416 | B2 * | 3/2005 | Cho | ........................... 327/299 |
| 7,420,873 | B2 * | 9/2008 | Jang | ....................... 365/233.1 |

FOREIGN PATENT DOCUMENTS

| | | |
|---|---|---|
| JP | 2000-030438 A | 1/2000 |
| KR | 2000-0041581 | 7/2000 |
| KR | 2001-0004224 | 1/2001 |
| KR | 2001-0063033 | 7/2001 |
| KR | 10-2004-0100249 | 12/2004 |
| KR | 10-2005-0003528 | 1/2005 |

* cited by examiner

*Primary Examiner*—Anh Phung
(74) *Attorney, Agent, or Firm*—Blakely, Sokoloff, Taylor & Zafman LLP

(57) ABSTRACT

A semiconductor memory device includes a clock enable buffer; a clock enable controller; a clock controller; a clock buffer; and a small clock buffer. The clock enable buffer buffers a clock enable signal to provide an internal clock enable signal. The clock enable controller synchronizes the internal clock enable signal with a small clock signal to output a first and a second signal. The clock controller generates a clock buffer enable signal and a small clock buffer enable signal based on the first and the second signals. The clock buffer is driven in response to the clock buffer enable signal and buffers a clock to produce a clock pulse. The small clock buffer is driven in response to the small clock buffer enable signal and buffers the clock to produce the small clock signal.

14 Claims, 10 Drawing Sheets

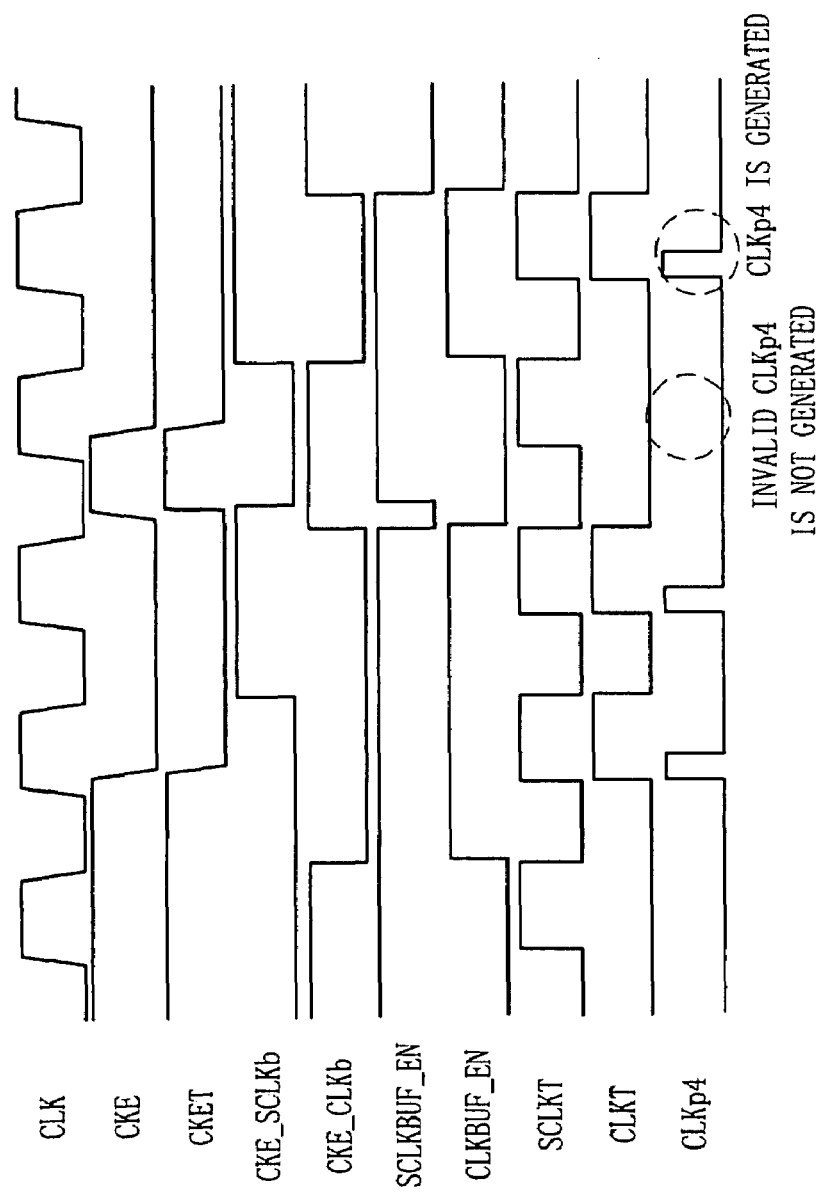

MEMORY DEVICE HAVING SMALL CLOCK BUFFER

CROSS-REFERENCE TO RELATED APPLICATIONS

The present invention claims priority of Korean patent application number 10-2006-0096305, filed on Sep. 29, 2006, which is incorporated by reference in its entirety.

BACKGROUND OF THE INVENTION

The present invention relates to a semiconductor memory device, and, more particularly, to a buffer for buffering an external clock in a memory device using a clock.

In low power memory devices, a scheme of turning off a clock buffer has been used for reduction of power consumption in a power-down mode and a self refresh mode. A conventional buffer and its peripheral control circuits will be described with reference to the drawings hereinafter.

FIG. 1 shows a conventional buffer and its peripheral circuits.

As shown in the drawing, the conventional buffer and its peripheral circuits include a clock enable buffer 110, a clock enable controller 120, a clock controller 130 and a clock buffer 140. The clock enable buffer 110 and the clock buffer 140 buffer a clock enable signal CKE and a clock CLK, respectively, and the clock buffer 140 is turned on or off by the control of its peripheral circuits, i.e., the clock enable controller 120 and the clock controller 130.

FIG. 2 is a detailed circuit diagram of the conventional clock buffer 140 shown in FIG. 1.

The conventional clock buffer 140 is provided with an inverter 141 composed of PMOS and NMOS transistors which take the external clock CLK via their gates, a PMOS transistor 142 and a NMOS transistor 143 for turning on or off the clock buffer 140 under the control of a clock buffer enable signal CLKBUF_EN, an inverter 144 for inverting and buffering an output of the inverter 141 to output a buffered clock CLKT, a delay line 145 for generation of a clock pulse CLKp4, two inverters 146 and 148, and a NAND gate 147.

In operation, the clock buffer 140 buffers an external clock CLK by the two inverters 141 and 144 connected in series, and delays and inverts the buffered clock CLKT by the delay line 145 and the inverter 146. Then, it NAND-operates the buffered clock and the clock CLKT from the inverter 144, and again inverts the NAND-operated result by the inverter 148 to output a clock pulse CLKp4. The PMOS and NMOS transistors 142 and 143, which take the clock buffer enable signal CLKBUF_EN via their respective gates, serve to turn off the clock buffer 140 when the clock buffer enable signal CLKBUF_EN of a low level is applied thereto.

FIG. 3 is a detailed circuit diagram of the conventional clock enable buffer 110 shown in FIG. 1.

The conventional clock enable buffer 110 is provided with two inverters 111 and 112 connected in series for buffering the clock enable signal CKE, an inverter 113 for inverting the buffered clock enable signal to provide an inverted clock enable signal CKEb, and a delay (setup hold delay) line 114 for delaying the buffered clock enable signal from the inverter 112 to output an internal clock enable signal CKET. The reason that delays the internal clock enable signal CKET by using the delay line 114 is to secure a setup hold time within the memory device.

FIG. 4 is a detailed circuit diagram of the conventional clock enable controller 120 shown in FIG. 1.

The conventional clock enable controller 120 is constituted by a first, a second and a third latch circuits 122 to 124, each having a corresponding one of pass gates PG1, PG2, and PG3 which are turned on or off by the clock CLKT buffered by the clock buffer 140.

In operation, the internal clock enable signal CKET is inverted by going through the inverter 121, and inverted and latched by the first latch circuit 122 at a falling edge of the clock CLKT buffered by the first pass gate PG1 which is turned on when a low signal is applied thereto. Further, the inverted and latched clock signal CKET is inverted and latched once again by the second latch circuit 123 at a rising edge following the falling edge of the clock CLKT buffered by the second pass gate PG2 which is turned on when a high signal is inputted thereto. Then, the signal latched by the second latch circuit 123 is inverted and latched once more at a falling edge following the rising edge of the clock CLKT buffered by the third pass gate PG3 which is turned on when a low signal is applied thereto. Lastly, the inverted and latched signal is inverted by an inverter 125 to output a delayed and inverted clock enable signal CKE_CLKb.

FIG. 5 depicts a detailed circuit diagram of the conventional clock controller 130 shown in FIG. 1.

The conventional clock controller 130 is constituted by a NOR gate 131, an inverter 132, and a NAND gate 133 which logically combine a LAS idle signal RASIDLE, a self refresh signal SREF, the inverted clock enable signal CKEb, and the delayed and inverted clock enable signal CKE_CLKb, to provide the clock buffer enable signal CLKBUF_EN.

In operation, when the LAS idle signal RASIDLE is a low level (i.e., active state) and the self refresh signal SREF is a low level (i.e., in case of no self refresh mode), an output of the NOR gate 131 becomes a high signal. Then, the high signal is inverted by the inverter 132 to apply a low signal to the NAND gate 133, and therefore, the clock buffer enable signal CLKBUF_EN outputted from the NAND gate 133 always becomes a high level. That is, the clock buffer 140 is always enabled.

Although any one of the LAS idle signal RASIDLE and the self refresh signal SREF is a high level, a high signal is applied to the NAND gate 133 and an output of the NAND gate 133 is decided by the control of the inverted clock enable signal CKEb and the delayed and inverted clock enable signal CKE_CLKb. In other words, the clock enable signal CLKBUF_EN becomes a low level only when the inverted clock enable signal CKEb and the delayed and inverted clock enable signal CKE_CLKb are all a high level, thereby turning off the clock buffer 140.

FIG. 6 is a timing chart describing the problems of the prior art.

As described above, in case of configuring the clock buffer 140 and the peripheral circuits 110 to 130, there occurs a failure or defect when the clock enable signal CKE is applied, in the state where the LAS idle signal RASIDLE is a high level, as depicted in the timing diagram. In the memory device, the state of the clock enable signal CKE at a rising edge of a (N−1)st clock defines the state of an Nth clock which is the following clock. As depicted in the timing diagram, therefore, if the clock enable signal CKE is a high level at a rising edge of a second clock 2CLK, the internal clock pulse CLKp4 is generated until a third clock 3CLK. And, the clock enable signal CKE is a high level at a rising edge of a fourth clock 4CLK, and thus, the clock pulse CLKp4 has to be generated at a fifth clock 5CLK. As shown in the timing diagram, however, the clock pulse CLKp4 which was not generated at the fourth clock 4CLK is generated and the clock pulse which should be generated at the fifth clock 5CLK is not generated.

The following are details of the above problems. First, in a standby state where the LAS idle signal RASIDLE is a high level, there occurs a failure or defect when the clock enable signal CKE falls to a low level at a high interval of the second clock 2CLK. Meanwhile, the clock buffer enable signal CLK-BUF_EN is created by the NAND combination of the inverted clock enable signal CKEb and the delayed and inverted clock enable signal CKE_CLKb. Therefore, if the two inputs are all high level, the clock buffer enable signal CLKBUF_EN becomes disabled to a low level. Thus, the clock buffer enable signal CLKBUF_EN is a high level till the high interval of the second clock 2CLK, and therefore, the clock buffer enters a turn-on state, which generates the clock pulse CLKp4. When the clock enable signal CKE rises to a high level at a low interval of the third clock 3CLK, the inverted clock enable signal CKEb becomes a low level. Therefore, the clock buffer enable signal CLKBUF_EN KEb is a low level for a while and rises back to a high level. At the interval where the fourth clock 4CLK is a high level, when the clock enable signal CLK falls to a low level, the inverted clock enable signal CKEb becomes a high level. The falling of the fourth clock 4CLK does not happen yet, and thus, the delayed and inverted clock enable signal CKE_CLKb is a high level. Therefore, the clock buffer enable signal CLKBUF_EN becomes a low level again, and the internally buffered clock CLKT becomes a low level. At this time, the delayed and inverted clock enable signal CKE_CLKb becomes a low level again, and therefore, the clock buffer enable signal CLK-BUF_EN becomes a high level again, thus turning on the clock buffer. The clock is at the high interval yet, and thus the buffered clock CLKT becomes a high level again. The clock buffer maintains the turn-on state until the falling of the fourth clock 4CLK. When the falling of the fourth 4CLK occurs, the delayed and inverted clock enable signal CKE_CLKb becomes a high level, thus turning off the buffer. Thus, there occurs a failure or defect in which the buffered clock CLKT of a high level is abnormally generated twice at the high interval of the fourth clock 4CLK, and the clock pulse CLKp4 that has to be generated is not generated in the fifth clock 5CLK.

In other words, in the standby state where the LAS idle signal RASIDLE is a high level, if the clock enable signal CKE falls to a logic low, the memory device enters into a power-down mode which makes the clock buffer turned off. In case where the clock enable signal CKE transits back to a high level to escape from the power-down mode, there takes place a failure or defect in which the clock pulse CLKp4 is not created in a specific condition. This problem is solved by a method which always turns on a small clock buffer introduced therein, in devices other than the low power memory device. However, it is not possible to realize the low power device using such a method of turning on the small clock buffer all the times.

SUMMARY OF THE INVENTION

Embodiments of the present invention are directed to provide a semiconductor memory device including a clock buffer for buffering an external clock.

In accordance with an aspect of the present invention, there is provided a semiconductor memory device including: a clock enable buffer; a clock enable controller; a clock controller; a clock buffer; and a small clock buffer. The clock enable buffer buffers a clock enable signal to provide an internal clock enable signal. The clock enable controller synchronizes the internal clock enable signal with a small clock signal to output a first and a second signals. The clock controller generates a clock buffer enable signal and a small clock buffer enable signal based on the first and the second signals. The clock buffer is driven in response to the clock buffer enable signal and buffers a clock to produce a clock pulse. The small clock buffer is driven in response to the small clock buffer enable signal and buffers the clock to produce the small clock signal.

In accordance with another aspect of the present invention, there is provided a semiconductor memory device including a clock buffer; a small clock buffer; a clock enable buffer; a clock enable controller; and a clock controller. The clock buffer buffers a clock to provide a buffered clock and a clock pulse. The small clock buffer buffers the clock to output a small clock signal. The clock enable buffer buffers a clock enable signal to provide an internal clock enable signal. The clock enable controller latches the internal clock enable signal in response to the small clock signal. The clock controller generates a signal to control an enable of each of the clock buffer and the small clock buffer based on an output signal of the clock enable controller.

BRIEF DESCRIPTION OF THE DRAWINGS

FIG. 12 is a timing diagram showing that the defective problem of the prior art is improved by the present invention.

DESCRIPTION OF SPECIFIC EMBODIMENTS

Hereinafter, a preferred embodiment of the present invention will be set forth in detail with reference to the accompanying drawings so that a person skilled in the art can easily carry out the invention.

Figure 7:
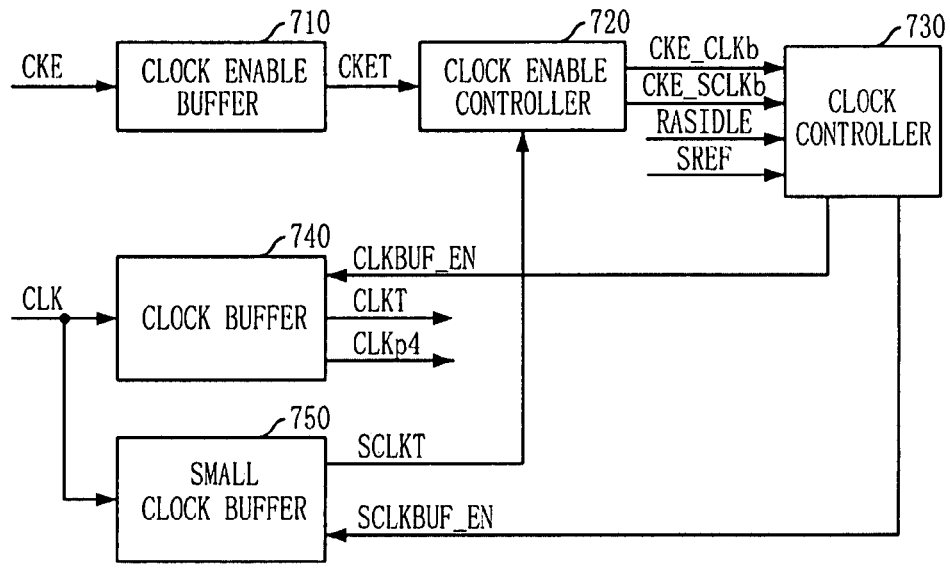
FIG. 7 illustrates a block diagram of a memory device having a small clock buffer in accordance with a preferred embodiment of the present invention.

FIG. 7 illustrates a block diagram of a memory device having a small clock buffer in accordance with a preferred embodiment of the present invention.

As shown therein, the memory device of the present invention includes a clock enable buffer 710, a clock enable controller 720, a clock controller 730, a clock buffer 140, and a small clock buffer 750. Among the above components, the clock enable buffer 710 has the same structure as the conventional clock buffer 140. A difference between the present invention and the prior art in structure is that the clock enable controller 720 is controlled by a small clock SCLKT buffered by the small clock buffer 750 and the small clock buffer 750 is also turned on or off by the control of the clock controller 730.

Figure 8:
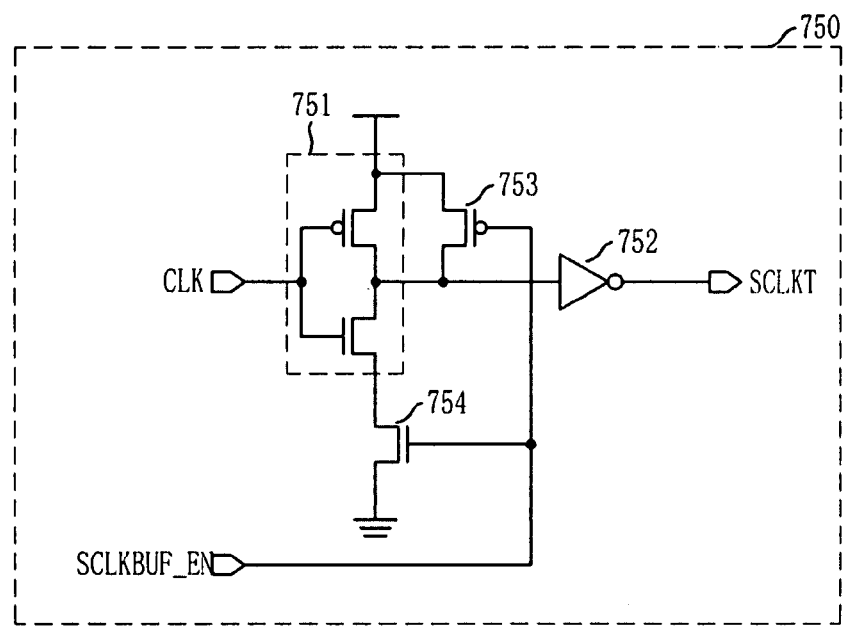
FIG. 8 is a detailed circuit diagram showing one example of the small clock buffer depicted in FIG. 7.

FIG. 8 is a detailed circuit diagram showing one example of the small clock buffer 750 depicted in FIG. 7.

The small clock buffer 750 is constituted by two inverters 751 and 752 connected in series for buffering an external clock CLK to output a small clock SCLKT. In order to make the small clock buffer 750 turn on or off in response to a small clock buffer enable signal SCLKBUF_EN, it is provided with PMOS and NMOS transistors 753 and 754 that take the small clock buffer enable signal SCLKBUF_EN via their gates. When the small clock buffer enable signal SCLKBUF_EN of a high level is applied, normal buffering is conducted by making the NMOS transistor 754 turn on by the two inverters 751 ad 752. But, when the small clock buffer enable signal SCLKBUF_EN of a low level is applied, the PMOS transistor 753 is turned on, and thus, a high level is inputted to the inverter 752, and the small clock SCLKT of a low level is always outputted. A difference between the small clock buffer 750 and the clock buffer 740 is that since the small clock buffer 750 does not need to generate the clock pulse CLKp4, there exists no need for the logic for doing so. Thus, the clock buffer 740 may be used as it is for the above purpose.

Figure 9:
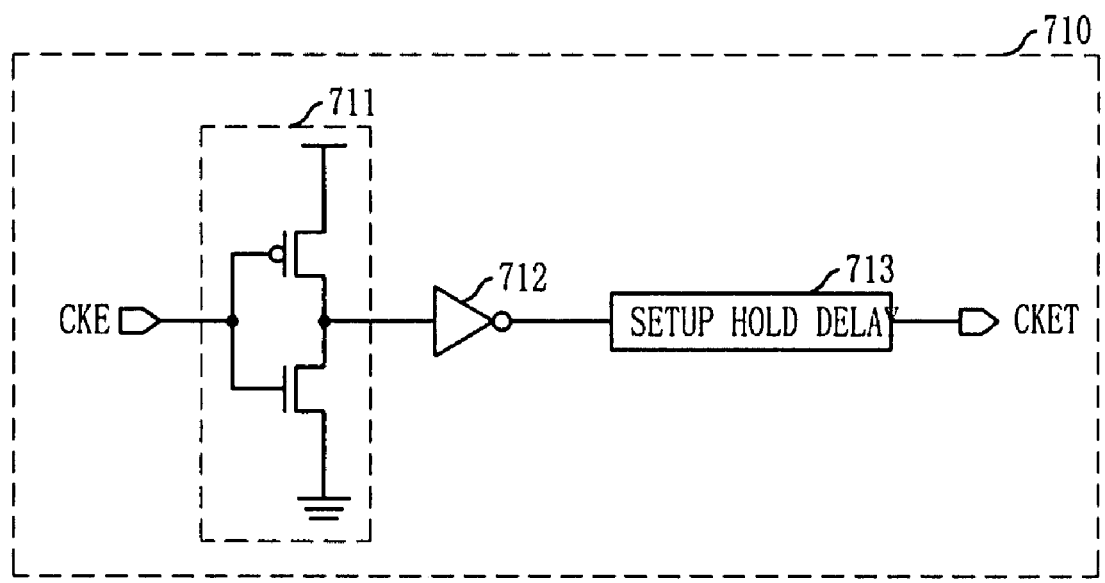
FIG. 9 is a detailed circuit diagram showing one example of the clock enable buffer depicted in FIG. 7.

FIG. 9 is a detailed circuit diagram illustrating one example of the clock enable buffer 710 shown in FIG. 7.

The clock enable buffer 710 of the invention is provided with two inverters 711 and 712 connected in series for buffering the clock enable signal CKE, and a delay (setup hold delay) line 713 for securing a setup hold time to output an internal clock enable signal CKET. The clock enable buffer 710 is almost similar in structure to the conventional clock enable buffer 110, and therefore, it is possible to use the conventional clock enable buffer 110 as it is. In the present invention, however, since the inverted clock enable signal CKEb is not used, the inverter 113 used in the prior art is no longer needed.

Figure 10:
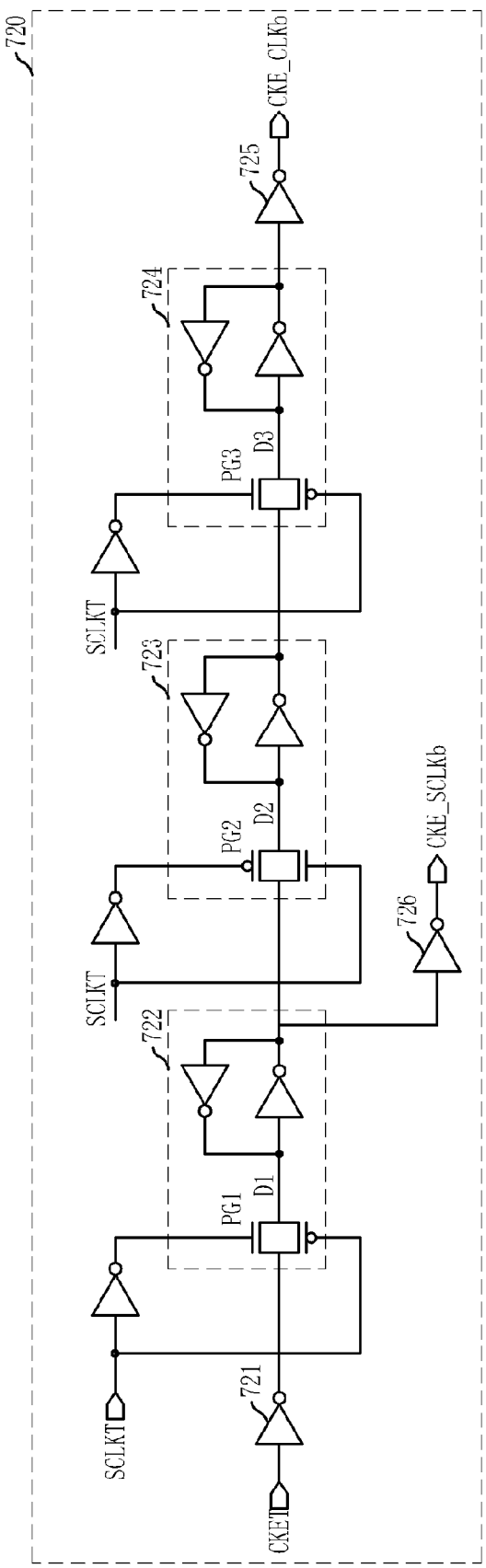
FIG. 10 is a detailed circuit diagram showing one example of the clock enable controller depicted in FIG. 7.

FIG. 10 is a detailed circuit diagram illustrating one example of the clock enable controller 720 shown in FIG. 7.

The conventional clock enable controller 120 latches the internal clock enable signal CKET depending on the buffered clock CLKT, but the clock enable controller 720 of the invention latches the internal clock enable signal CKET according to the small clock signal SCLKT to output a first signal CKE_SCLKb and a second signal CKE_CLKb.

The clock enable controller 720 is constituted by first, second and third latch circuits 722 to 724 coupled in series, and first, second and third pass gates PG1, PG2, and PG3 which are connected to the latch circuits, respectively. Each of the pass gates PG1, PG2, and PG3 composed of PMOS and NMOS transistors is turned on or off by the control of the small clock signal SCLKT and latched by inverters to which input and output terminals of the latch circuits 722 to 724 are connected.

In operation, the internal clock enable signal CKET is inverted by the inverter 721 and inputted, and then inverted and latched by the first latch circuit 722 by making the first pass gate PG1 turn on when the small clock signal SCLKT is a low level (falling edge). The output of the first latch circuit 722 is inverted by an inverter 726 to provide the first signal CKE_SCLKb to the clock controller 730. Namely, the first signal CKE_SCLKb is a signal which is obtained by latching and inverting the internal clock enable signal CKET at the falling edge of the small clock signal SCLKT.

The second pass gate PG2 is turned on when the small clock signal SCLK is a high level and thus the second latch circuit 723 inverts and latches a signal from the first latch circuit 722. The third pass gate PG3 is turned on when the small clock signal SCLK is a low level and thus the third latch circuit 723 inverts and latches a signal from the second latch circuit 722. Accordingly, the third pass gate PG3 is turned on later than the first pass gate PG1 by one clock. The signal stored in the third latch circuit 724 is inverted by the inverter 725 and then outputted as the second signal CKE_CLKb, which is the same as the first signal CKE_SCLKb in waveform, but is a signal that is obtained by delaying it by one clock.

Figure 11:
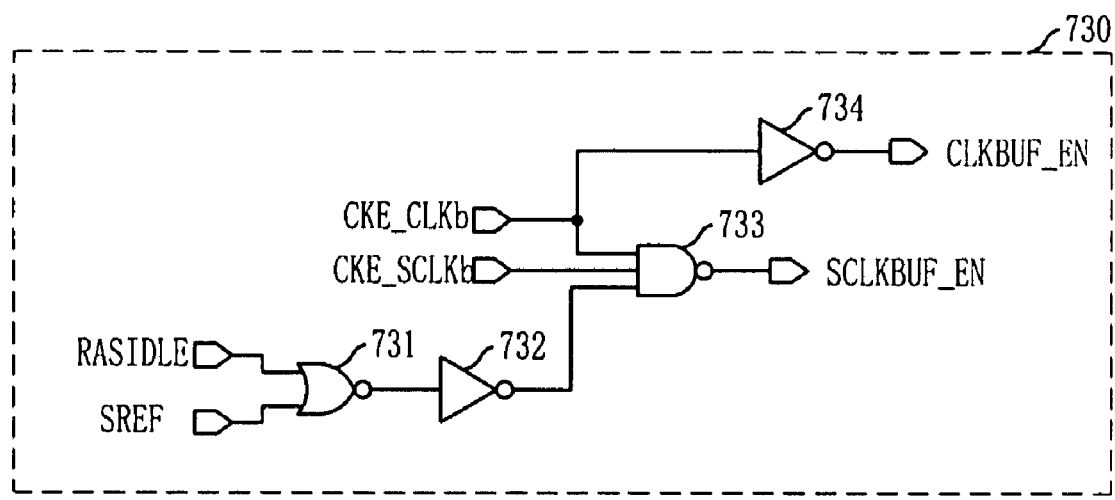
FIG. 11 is a detailed circuit diagram showing one example of the clock controller depicted in FIG. 7.

FIG. 11 depicts a detailed circuit diagram of the clock controller shown in FIG. 7.

As shown therein, the clock controller 730 is constituted by a first inverter 734 for inverting the second signal CKE_CLKb to output the clock buffer enable signal CLKBUF_EN, a NOR gate 731 taking a LAS idle signal RASIDLE and a self refresh signal SREF, a second inverter 732 for inverting an output of the NOR gate 731, and a NAND gate 733 which logically combines the first and the second signals CKE_SCLKb and CKE_CLKb and an output of the second inverter 732, to generate the small clock buffer enable signal SCLKBUF_EN.

The clock buffer enable signal CLKBUF_EN generated by inverting the second signal CKE_CLKb by first inverter 734 functions to turn on or off the clock buffer 740.

The small clock buffer enable signal SCLKBUF_EN is created by combining the first signal CKE_SCLKb, the second signal CKE_CLKb, the LAS idle signal RASIDLE and the self refresh signal SREF. When both the LAS idle signal RASIDLE and the self refresh signal SREF are low level, the output of the NOR gate 731 becomes a high level. This is inverted by the second inverter 732 to apply a low signal to the NAND gate 733, and therefore, the small clock buffer enable signal SCLKBUF_EN becomes a high level regardless of the first signal CKE_SCLKb and the second signal CKE_CLKb. If either the LAS idle signal RASIDLE or the self refresh signal SREF is a high level, since the output of the second inverter 732 becomes a high level, the small clock buffer enable signal SCLKBUF_EN becomes a low level only when the first signal CKE_SCLKb and the second signal CKE_CLKb are all high level.

FIG. 12 is a timing diagram showing that the failure or defect problem of the prior art is improved by using the present invention.

Figure 1:
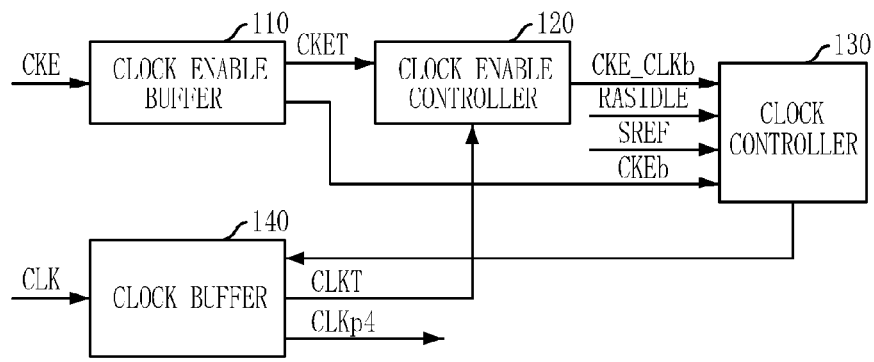
FIG. 1 shows a conventional buffer and its peripheral circuits.
Figure 2:
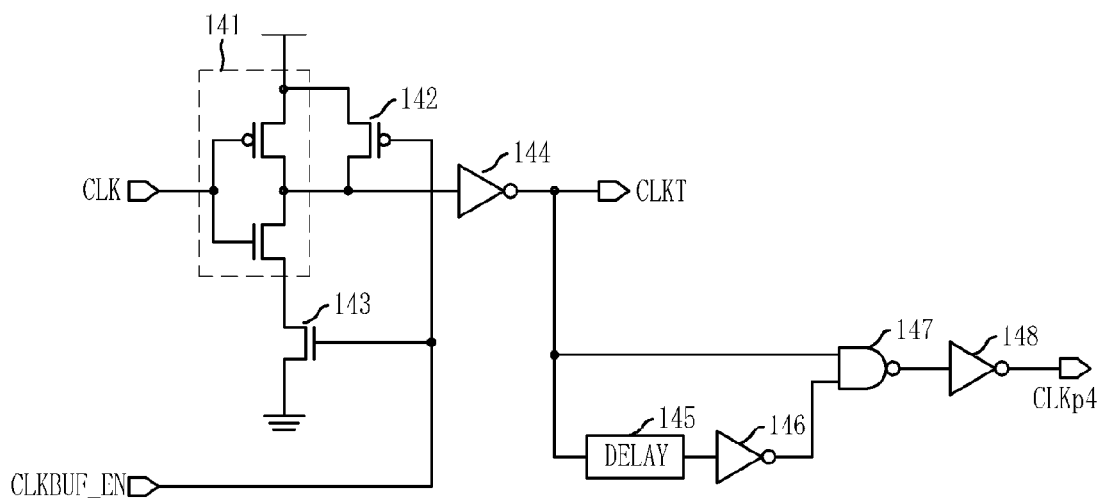
FIG. 2 is a detailed circuit diagram of the conventional clock buffer shown in FIG. 1.
Figure 3:
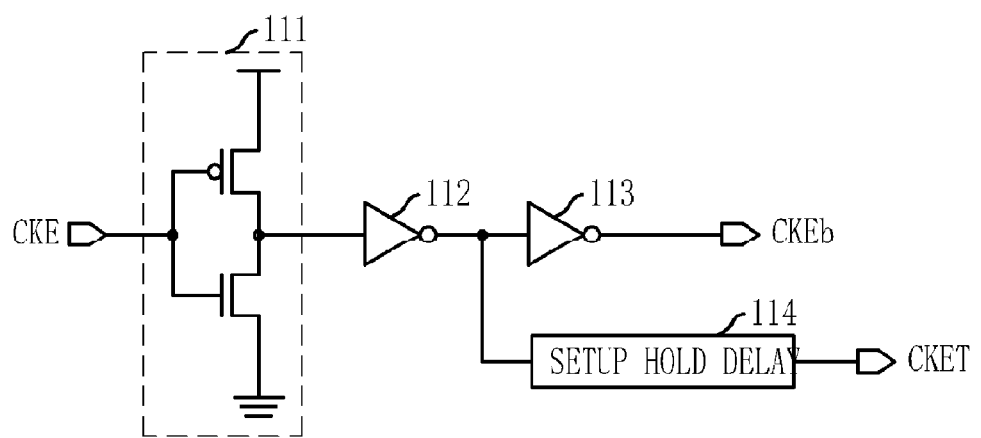
FIG. 3 is a detailed circuit diagram of the conventional clock enable buffer shown in FIG. 1.
Figure 4:
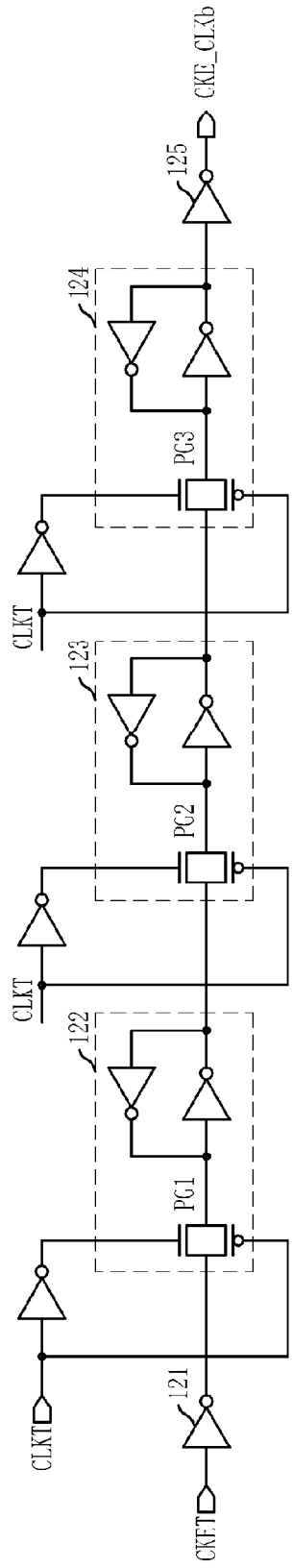
FIG. 4 is a detailed circuit diagram of the conventional clock enable controller shown in FIG. 1.
Figure 5:
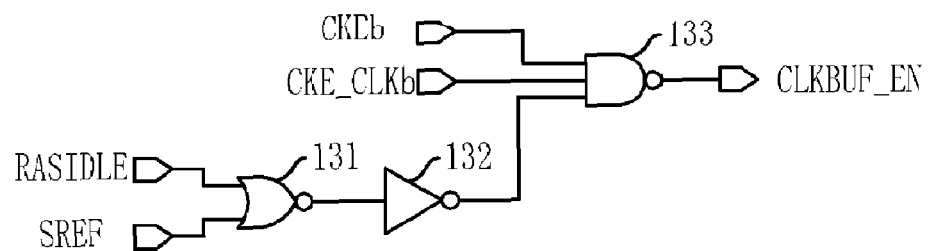
FIG. 5 is a detailed circuit diagram of the conventional clock controller shown in FIG. 1.
Figure 6:
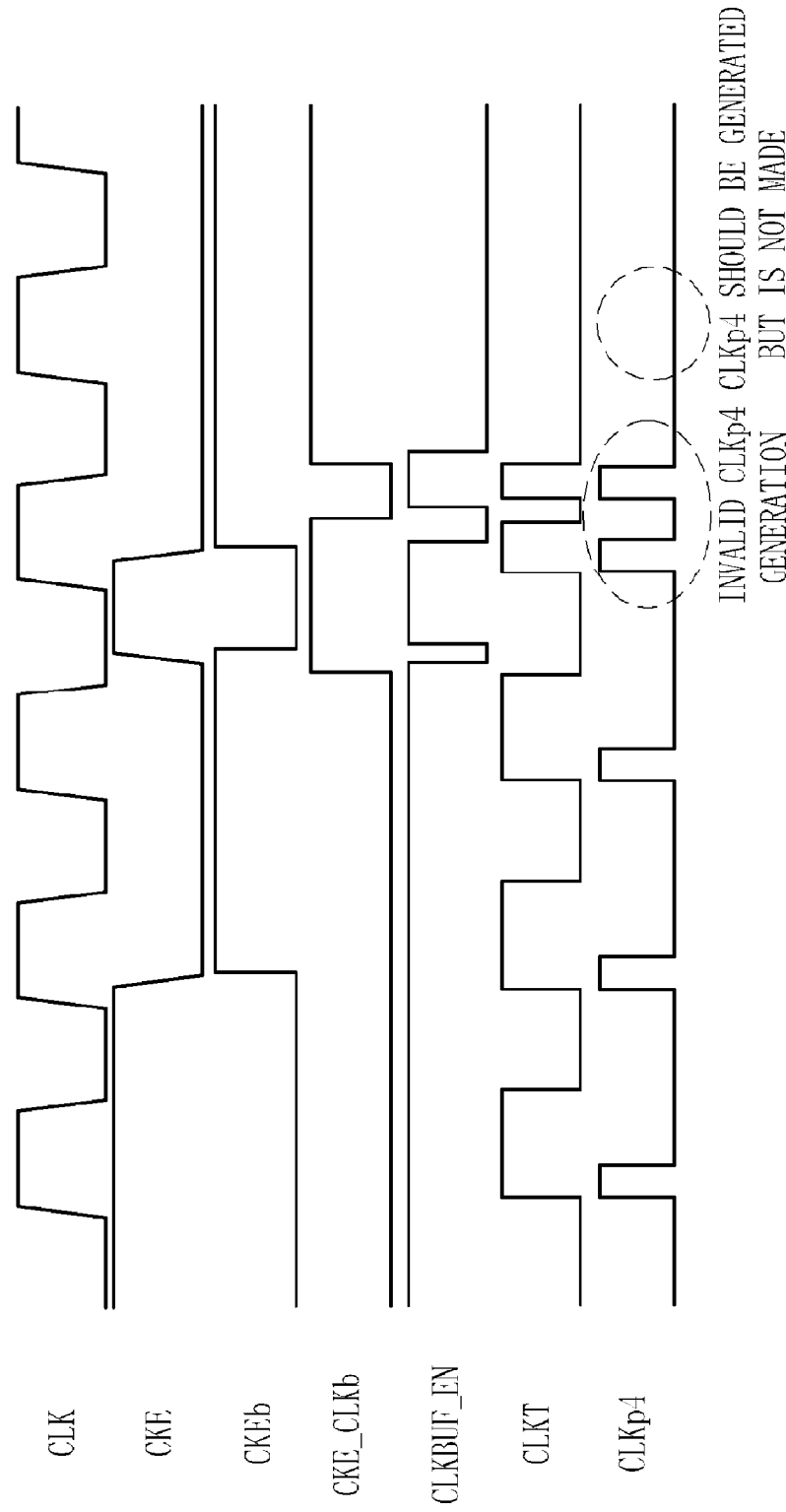
FIG. 6 is a timing diagram describing the problems of the prior art.

The timing diagram of FIG. 12 shows that the clock enable signal CKE falls to a low level at a high interval of the second clock 2CLK in the standby state where the LAS idle signal RASIDLE is a high level, as in the timing diagram of FIG. 6. At the high interval of the second clock 2CLK, when the clock enable signal CKE becomes a low level, the internal clock enable signal CKET that gives a setup hold delay to the clock enable signal CKE becomes a low level. At this time, the small clock signal SCLK is a high level, and therefore, the internal clock enable signal CKET is not inputted to the first latch circuit 722, but stored therein when the small clock signal SCLKT falls to a low level. Thus, the first signal CKE_SCLKb becomes a high level. When the small clock signal SCLKT rises back to a high level, the first pass gate PG1 of the first latch circuit 722 is closed and the second pass gate PG2 of the second latch circuit 723 is opened. At this time, the third pass gate PG3 of the third latch circuit 724 is closed and the internal clock enable signal CKET information is stored in the second latch circuit 723. When the small clock signal SCLKT falls back to a low level, the second latch circuit 723 is closed and the third latch circuit 724 is opened.

Thus, the internal clock enable signal CKET information is stored in the third latch circuit 724 and outputted. That is, the second signal CKE_CLKb of a high level is outputted in synchronism with the falling edge of the third clock 3CLK.

The small clock buffer enable signal SCLKBUF_EN is a signal which becomes a low level when the first signal CKE_SCLKb and the second signal CKE_CLKb are all high level. The clock buffer enable signal CLKBUF_EN is an inverted signal of the second signal CKE_CLKb. Thus, when the clock enable signal CKE rises to a high level at the low interval of the third clock 3CLK, the first signal CKE_SCLKb falls to a low level immediately since the first pass gate PG1 of the first latch circuit 722 is opened. When the first signal CKE-SCLKb falls to a low level, the small clock buffer enable signal SCLKBUF_EN is a low level for a while and rises back to a high level. The second signal CKE_CLKb becomes a low level in synchronism with the falling edge of the fourth clock 4CLK, so that the clock buffer enable signal CLKBUF_EN becomes a high level. Since the clock enable signal CKE is a low level at the high interval of the fifth clock 5CLK, the second signal CKE_CLKb becomes a high level at the falling edge of the fifth clock 5CLK. The first signal CKE_SCLKb is a high level from the falling edge of the fourth clock 4CLK, and therefore, both the small clock buffer enable signal SCLKBUF_EN and the clock buffer enable signal CLKBUF_EN become low level from the falling edge of the fifth clock 5CLK, as shown in the timing diagram. Thus, the small clock buffer 750 and the clock buffer 740 become all turned off. As a result, the clock buffer 740 becomes enabled at the second, third and fifth clocks, and the normal clock pulse CLKp4 is generated only at the second, third and fifth clocks, so that an erroneous clock pulse CLKp4 is no longer generated.

As described above, the present invention introduces a small clock buffer, in addition to the existing clock buffer, and configures in a manner that the small clock buffer is turned off at a timing other than the clock buffer. Accordingly, the present invention can prevent a failure or defect in which the clock pulse CLKp4 is not generated in a specific condition in case of escaping from the power-down mode.

Therefore, the present invention can remove the possibility of occurrence of failure or defect at the specific timing in advance, and thus has a wide range in terms of specifications.

In addition, present invention controls the small clock buffer to be turned on or off, which can be usefully employed for low power devices.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    a clock enable buffer for buffering a clock enable signal to provide an internal clock enable signal;
    a clock enable controller for synchronizing the internal clock enable signal with a small clock signal to output a first and a second signal;
    a clock controller for generating a clock buffer enable signal and a small clock buffer enable signal based on the first and the second signals;
    a clock buffer which is driven in response to the clock buffer enable signal and buffers a clock to produce a clock pulse; and
    a small clock buffer which is driven in response to the small clock buffer enable signal and buffers the clock to produce the small clock signal.

2. The semiconductor memory device as recited in claim 1, wherein the internal clock enable signal is delayed to comply with a margin of a setup hold time.

3. The semiconductor memory device as recited in claim 1, wherein the clock enable controller provides the first signal by latching and inverting the internal clock enable signal at a falling edge of the small clock signal, and outputs the second signal which is later than the first signal by one clock.

4. The semiconductor memory device as recited in claim 1, wherein the clock enable controller includes first, second, and third latch circuits connected in series, and first, second, and third pass gates which are connected to the respective corresponding latch circuits.

5. The semiconductor memory device as recited in claim 4, wherein the first and the third latch circuits are turned on when the small clock signal is a low level, the second latch circuit is turned on when the small clock signal is a high level, the first and the second signals being generated by inverting outputs of the first and the third latch circuits, respectively.

6. The semiconductor memory device as recited in claim 1, wherein the clock controller inverts the second signal to generate the clock buffer enable signal, and outputs the small clock buffer enable signal which is disabled when the first and the second signals are all high level.

7. The semiconductor memory device as recited in claim 6, wherein the clock controller always enables the small clock buffer enable signal when a self refresh signal and a LAS idle signal are all disabled.

8. The semiconductor memory device as recited in claim 1, wherein the clock controller includes:
    a first inverter for inverting the second signal to output the clock buffer enable signal;
    a NOR gate receiving a LAS idle signal and a self refresh signal;
    a second inverter for inverting an output of the NOR gate; and
    a NAND gate for producing the small clock buffer enable signal based on the first and the second signals and an output of the second inverter.

9. The semiconductor memory device as recited in claim 1, wherein the clock buffer buffers the clock by using two inverters, and AND-operates the buffered clock and a clock which is made by inverting and delaying the buffered clock, to thereby output the clock pulse.

10. The semiconductor memory device as recited in claim 1, wherein the small clock buffer buffers the clock by using two inverters to generate the small clock signal.

11. A semiconductor memory device comprising:
    a clock buffer for buffering a clock to provide a buffered clock and a clock pulse;
    a small clock buffer for buffering the clock to output a small clock signal;
    a clock enable buffer for buffering a clock enable signal to provide an internal clock enable signal;
    a clock enable controller for latching the internal clock enable signal in response to the small clock signal; and
    a clock controller for generating a signal to control an enable of each of the clock buffer and the small clock buffer based on an output signal of the clock enable controller.

12. The semiconductor memory device as recited in claim 11, wherein the internal clock enable signal is delayed to comply with a margin of a setup hold time.

13. The semiconductor memory device as recited in claim 11, wherein the clock enable controller provides the first signal by latching and inverting the internal clock enable signal at a falling edge of the small clock signal, and outputs the second signal which is later than the first signal by one clock.

14. The semiconductor memory device as recited in claim 13, wherein the clock controller inverts the second signal to generate a clock buffer enable signal to control the clock buffer, and outputs a small clock buffer enable signal to control the small clock buffer when the first and the second signals are all high level.

* * * * *